United States Patent
Umehara et al.

(10) Patent No.: US 6,225,703 B1
(45) Date of Patent: May 1, 2001

(54) SEMICONDUCTOR DEVICE

(75) Inventors: Norito Umehara, Ibaraki; Chikara Azuma, Beppu; Akira Karashima, Oita, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/350,868

(22) Filed: Jul. 9, 1999

(30) Foreign Application Priority Data

Jul. 9, 1998 (JP) .................................................. 10-194296

(51) Int. Cl.$^7$ ........................... H01L 23/28; H01L 23/48; H01L 29/40
(52) U.S. Cl. ........................... 257/787; 257/734; 257/735; 257/738; 257/783
(58) Field of Search ..................................... 257/678, 690, 257/692–697, 706–707, 712–713, 729, 734, 735, 737, 738, 782, 783, 787–796

(56) References Cited

U.S. PATENT DOCUMENTS

| 4,994,895 | * | 2/1991 | Matsuzaki et al. | 357/72 |
| 5,493,153 | * | 2/1996 | Arikawa et al. | 257/796 |
| 5,814,883 | * | 9/1998 | Sawai et al. | 257/712 |
| 5,864,175 | * | 1/1999 | Burns | 257/684 |

* cited by examiner

Primary Examiner—David Mis
(74) Attorney, Agent, or Firm—William B. Kempler; Frederick J. Telecky, Jr.

(57) ABSTRACT

The purpose of the present invention is to reduce the warpage of the semiconductor package caused by thermal contraction. According to the present invention, semiconductor device (9) has plate-shaped member (7) which is positioned on a surface of semiconductor chip (1) and is sealed together with semiconductor chip (1) with molding resin (8). Said plate-shaped member (7) has a linear expansion coefficient that is less than the linear expansion coefficient of the aforementioned molding resin. By placing a plate-shaped member with a small linear expansion coefficient on semiconductor chip (1), it is possible to reduce the thermal contraction on the upper side of the semiconductor chip. Also, the presence of the plate-shaped member on the semiconductor chip leads to substantial reduction in the thickness of the molding resin on the semiconductor chip. The pulling force due to contraction of the molding resin that leads to warping is proportional to the thickness of the molding resin. Consequently, by using semiconductor device (9) of the present invention that contains the aforementioned plate-shaped member, it is possible to reduce the warpage of the package to a very low level.

20 Claims, 3 Drawing Sheets

SEMICONDUCTOR DEVICE

FIELD OF THE INVENTION

The present invention pertains to a type of semiconductor device having a package structure preferred for reducing warping of the package.

BACKGROUND OF THE INVENTION

Usually, in order to protect the semiconductor chip from moisture and ambient pollution the semiconductor devices is sealed with a plastic, ceramic, or a molding resin. In consideration of mass productibility, cost, and other factors, the packaging using the transfer mold forming method is most widely adopted at the present time. In the transfer mold forming method, the semiconductor chip assembly is placed in the mold die, and a thermosetting resin is flowed into the die. The die is brought to a high temperature to cure the resin, forming a package with the chip sealed therein.

There are several intrinsic problems with the transfer mold forming method that must be taken into consideration when the method is used. One problem is related to the warping of the molded semiconductor package. In the case of mold forming, curing is carried out at a temperature as high as 175° C., and the package is then cooled naturally to room temperature. In this case, warping occurs due to the difference between the linear expansion coefficient of silicon as the raw material of the semiconductor chip and the phenol based, epoxy-based or other thermosetting resin used as the molding resin. The warping leads to uneven contact of the connecting terminals on the substrate when the semiconductor package is assembled on a printed-circuit board. As a result, the assembly reliability deteriorates. Also, the larger the package or the chip, the greater the adverse influence of the warping of the package relative to its flatness. As a result, it becomes difficult to effect a highly reliable assembly process.

A method used to solve this problem is forming the molding resin on both sides of the semiconductor chip to the same thickness, that is, centering the semiconductor chip with respect to the package. However, this method cannot be used for certain types of packages. One of these packages is the BGA (Ball Grid Array) package. In the BGA package, the semiconductor chip is attached to an insulating substrate that has solder bumps in a two-dimensional arrangement, and the semiconductor chip is covered. On the insulating substrate, that is, on the surface on the side opposite to the solder bump forming surface of the insulating substrate, the molding resin is used to form the outer shape of the semiconductor device. In this case, the difference between the linear expansion coefficient of the molding resin and the insulating substrate leads to warping. Another semiconductor device that has a structure that does not allow the semiconductor chip to be centered relative to the package is the TQFP (Thin Quad Flat Package), which has an exposed die pad for heat dissipation purposes.

In order to minimize the warping of the package of this type of semiconductor device, it is effective to reduce the thickness of the molding resin. However, since the conductor wires are lead out from the principal surface of the semiconductor chip, the resin should at least be of sufficient thickness to entirely cover and shield the wires.

Consequently, the purpose of the present invention is to minimize the warping of the package caused by thermal contraction in the aforementioned semiconductor device.

SUMMARY OF THE INVENTION

The semiconductor device of the present invention comprises a semiconductor chip with first and second surfaces, and plural electrode pads on one surface. The semiconductor chip supported on a substrate comprising an insulating substrate and die pads, etc., with its first surface facing the substrate. The semiconductor device also contains conductor leads for electrically connecting the aforementioned semiconductor chip to the outside. The conductor leads and the electrode pads of the semiconductor chip are electrically connected to each other through a connecting means comprising conductor wires and conductor bumps, etc. With a portion of the aforementioned conductor leads exposed, the aforementioned semiconductor chip, the aforementioned conductor leads, and the aforementioned connecting means are sealed by the molding resin. The molding resin determines, the outer shape of the semiconductor device. According to the present invention, the semiconductor device has a plate-shaped member which is positioned on the second surface of the aforementioned semiconductor chip and is sealed by the aforementioned molding resin together with the aforementioned semiconductor chip. The plate-shaped member has a linear expansion coefficient that is less than the linear expansion coefficient of the aforementioned molding resin. By using a plate-shaped member with a relatively low linear expansion coefficient and placing on the semiconductor chip, it is possible to suppress the thermal contraction on the upper side of the semiconductor chip. Also, the presence of the plate-shaped member on the semiconductor chip substantially reduces the thickness of the molding resin on the semiconductor chip. The pulling force caused by the contraction of the molding resin generated by the warping is proportional to its thickness. Consequently, with the semiconductor device of the present invention that contains the aforementioned plate-shaped member, it is possible to suppress the warping of the package to a very low level.

According to the present invention, the linear expansion coefficient of the aforementioned plate-shaped member is preferably in the range of 1–20 ppm, and its modulus of elasticity is preferably in the range of 800–15,000 kg/mm$^2$. Examples of materials that have these properties include polyimide resin, ceramics, silicon, etc.

Also, it is preferred that the aforementioned plate-shaped member be bonded to the second surface of the aforementioned semiconductor chip.

Also, it is preferred that the aforementioned electrode pads be formed on the periphery of the second surface of the aforementioned semiconductor chip, and that the aforementioned plate-shaped member be located within the region surrounded by the electrode pads.

Also, the thickness of the aforementioned molding resin on the surface of the aforementioned plate-shaped member is preferably in the range of 0.05–0.4 mm. The thickness of the aforementioned plate-shaped member is preferably in the range of 0.08–1.0 mm.

An embodiment of the present invention will be explained below. FIGS. 1 and 2 illustrate an example of application of the present invention in BGA type semiconductor device 9. BGA type semiconductor device 9 has flexible insulating substrate 2 which is planar and is larger by a predetermined amount than semiconductor chip 1 it supports. In the application example, flexible insulating substrate 2 is a straight-chain nonthermoplastic polyimide with a thickness of about 70 μm (trade name: Eupirex [transliteration]). The upper surface of flexible insulating substrate 2 contains conductor pattern 3 formed by etching a copper foil. One end of each of the wires of conductor pattern 3 is connected through a via hole on the substrate to one of solder bumps 4 arranged in a two-dimensional configuration on the surface of the opposite side. The other end of each wire extends to the periphery of flexible insulating substrate 2, and is arranged such that one end of conductor wire 5 can be bonded.

Semiconductor chip 1 is bonded to flexible insulating substrate 2 with die-bonding material 6. Most of conductor pattern 3 formed on flexible insulating substrate 2 is covered with semiconductor chip 1, only the end portion extending in the periphery of the substrate is exposed on the upper surface of the peripheral portion of flexible insulating substrate 2. In the peripheral portion of the principal surface of semiconductor chip 1, that is, the surface where the circuit elements are formed, electrode pads 1a are arranged side by side in a columnal configuration. Conductor wire 5 extends from each electrode pad 1a and is bonded to one end of said conductor pattern 3. Conductor wires 5 are very fine wires with diameter of about 25 $\mu$m and made of gold (Au), aluminum (Al), or an alloy thereof. They project from the principal surface of the semiconductor chip, and reach conductor pattern 3 while forming a loop.

A plate-shaped member, that is, square sheet 7 is arranged on the region on the principal surface of the semiconductor chip surroundeds electrode pads 1a. Square sheet 7 is planar and smaller than the chip by about 0.5–3.0 mm, so that it does not interfere with conductor wires 5 on its periphery. Square sheet 7 is bonded on the principal surface of semiconductor chip 1 by means of a thermosetting or thermoplastic adhesive. It is possible to feed said square sheet 7 in the various manufacturing steps of semiconductor device 9. It is possible to feed square sheet 7 onto the chip before dicing of the semiconductor wafer, before carrying of semiconductor chip 1 on flexible insulating substrate 2, before bonding of the conductor wires, or before sealing of the package.

As far as the thickness of square sheet 7 is concerned, it is preferred that its surface height be greater than or equal to the projecting height of conductor wires 5. For example, if the projecting height of conductor wires 5 is in the range of 0.1–0.3 mm, the surface height of square sheet 7 from the chip, that is, the total thickness of square sheet 7 and adhesive, should be in the range of about 0.3–1.0 mm.

The linear expansion coefficient of square sheet 7 must be less than the linear expansion coefficient of molding resin 8, to be explained below. If the linear expansion coefficient of molding resin 8 is about 50–70 ppm/° C., the ideal linear expansion coefficient of square sheet 7 will be approximately half that, that is, in the range of about 1–30 ppm/° C. Also, the modulus of elasticity of square sheet 7 should be in the range of about 800–15,000 kg/mm$^2$. Examples of the materials that have these properties include polyimide resin (linear expansion coefficient: 12 ppm/° C., modulus of elasticity: 840 kg/mm$^2$), ceramics (linear expansion coefficient: 7.8 ppm/° C., modulus of elasticity: 15,000 kg/mm$^2$), and silicon (linear expansion coefficient: 2.62 ppm/° C., modulus of elasticity: 13,200 kg/mm$^2$). In particular, in consideration of the ease of handling, processibility, bonding of the molding resin to the semiconductor chip and other factors, polyimide resin is optimum.

The external form of semiconductor device 9 is determined by using molding resin 8 on said flexible insulating substrate 2. Molding resin 8 is injected under pressure using the transfer molding method. Molding resin 8 can completely cover semiconductor chip 1, square sheet 7, conductor wires 5 on flexible insulating substrate 2, and the end portion of conductor pattern 3 exposed on the substrate, thus protecting them from the outside.

As far as the thickness of molding resin 8 on square sheet 7 is concerned, from the standpoint of suppression of the thermal contraction, it is preferred that the molding resin be as thin as possible. On the other hand, in the transfer molding, it is necessary to have a gap between the dies and square sheet 7 to ensure reliable flow-in of the molding resin. The gap should be about 0.1–0.5 mm, and it becomes the thickness of the portion above square sheet 7.

FIG. 3 is a diagram illustrating an embodiment of the present invention in TQFP type semiconductor device 19. Semiconductor device 19 shown in the figure has lead frame 10 which has plural conductor leads 11 and die pad 12. Semiconductor chip 13 is attached to die pad 12 by means of die-bonding material 14. Wire bonding is performed between the electrode pads of semiconductor chip 13 and conductor leads 11. Die pad 12 is offset downward relative to the plane formed by lead frame 10, and it is exposed at the bottom surface of molding resin 16 that forms the outer shape of semiconductor device 19. Although not shown in the figure, the bottom surface of exposed die pad 12 is soldered onto a pattern of the substrate for assembly as a means of heat dissipation.

As in the aforementioned embodiment, square sheet 17 is bonded to a region of the principal surface of semiconductor chip 13 surrounded by columnar electrode pads. In order to completely cover and shield conductor wires 15 that project in the form of loops, molding resin 16 should not be too thin. Consequently, if there is no square sheet 17, molding resin 16 on semiconductor chip 13 becomes thicker, and, due to the asymmetry of the outer surface and inner surface of the package, the warping of molding resin 16 due to thermal contraction will be significant. By arranging square sheet 17 on semiconductor chip 13, the thickness of molding resin 16 on the chip can be reduced by the thickness of square sheet 17. In this way, the warping of the package cause by heat can be reduced.

An example of the present invention applied to a semiconductor device having a flip chip BGA package will be explained below. As shown in FIG. 4, flip chip BG4 package contains bump pads 40 made of gold, e.g., are formed on electrode pads (1a ) formed in the peripheral portion of semiconductor chip 1. Said bump pads 40 are bonded by heat pressing or the like on conductor leads 3 of flexible insulating substrate 2. After flexible insulating material 41 is inserted as an under file [sic] between semiconductor chip 1 and flexible insulating substrate 2 and square sheet 7 is set arranged on the other surface of semiconductor chip 1, the molding resin is injected by means of transfer molding to form completed semiconductor device 9. For the aforementioned semiconductor device having a flip chip, that is, a structure with the principal surface of the semiconductor chip facing downward, if it is impossible to keep the thickness of the package below a certain level, the thickness of the molding resin on semiconductor chip 1 would influence the warping of the package. In such a case, by setting said square sheet 7 on semiconductor chip 1, it is possible to reduce the thickness of molding resin 8.

REFERENCE NUMERALS AND SYMBOLS AS SHOWN IN THE DRAWINGS

Figure 1:
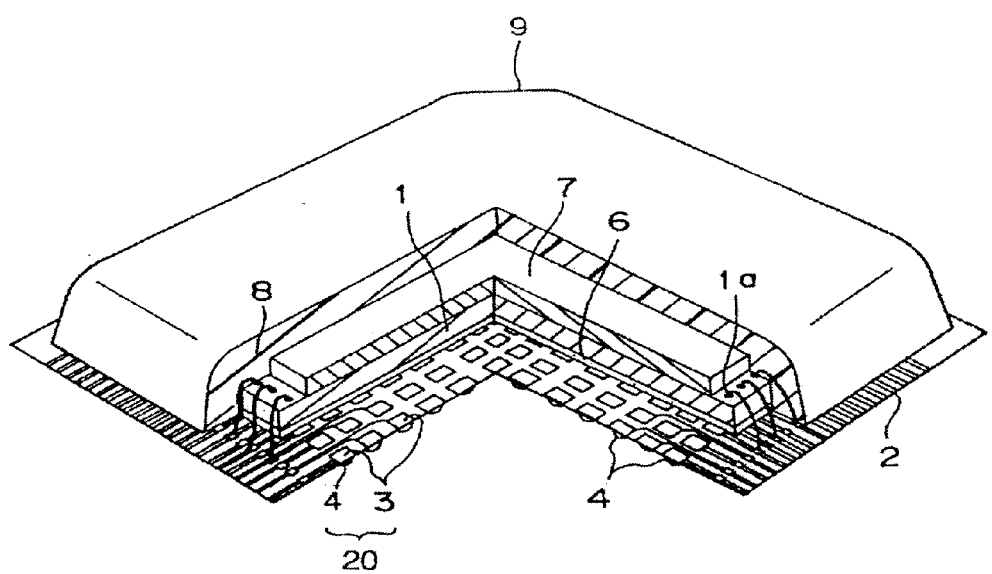
FIG. 1 is cutaway oblique view cut of the BGA type semiconductor device to which the present invention is applied.
Figure 2:
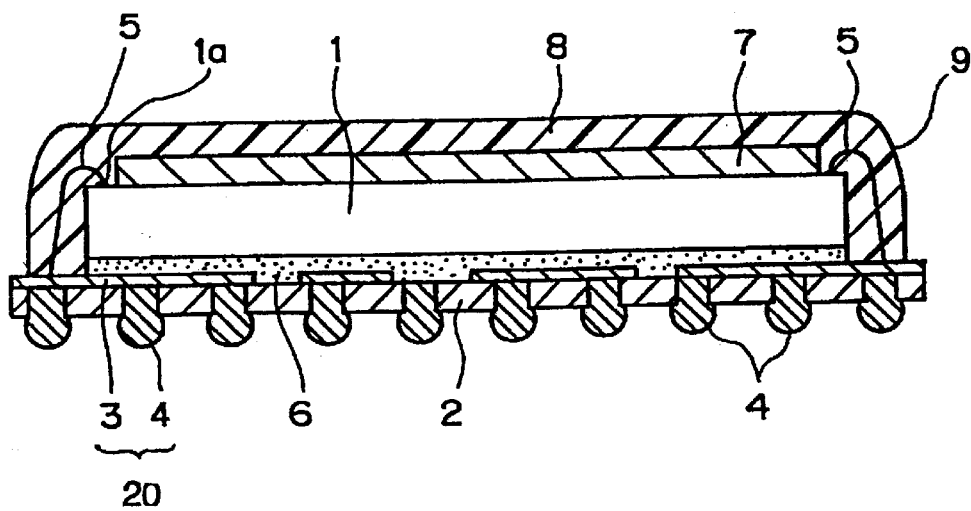
FIG. 2 is a cross section of the semiconductor device of FIG. 1.
Figure 3:
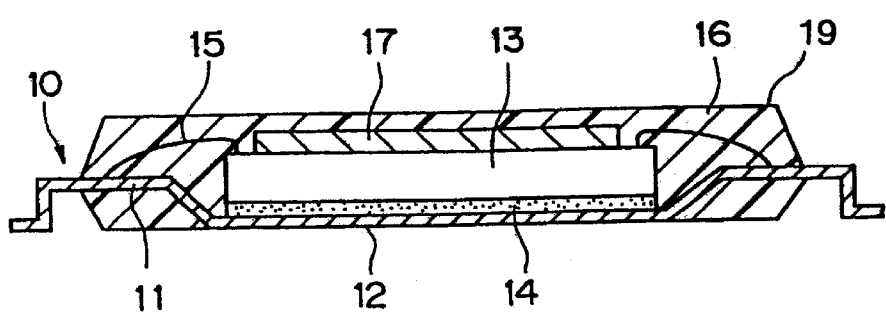
FIG. 3 is a cross section of the TQFP type semiconductor device to which the present invention is applied.
Figure 4:
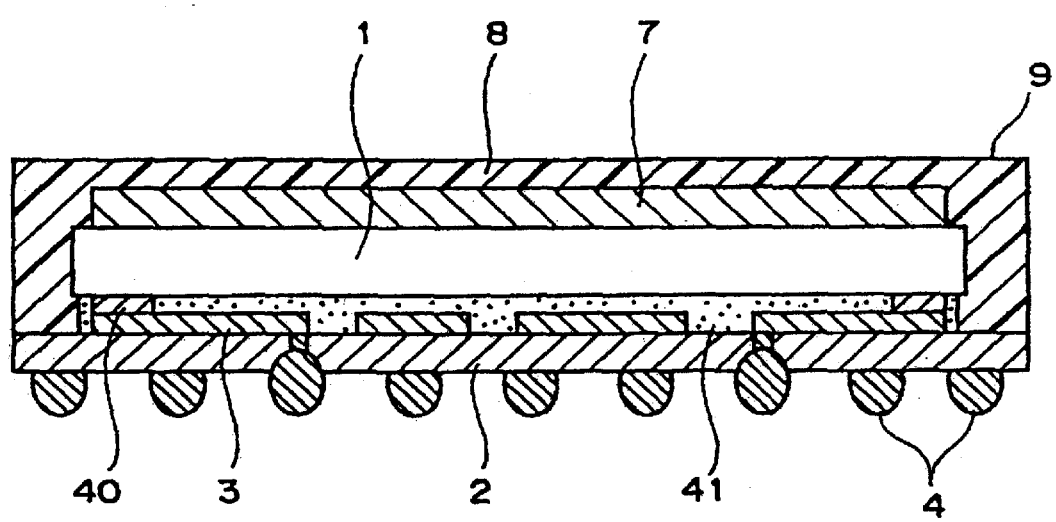
FIG. 4 is a cross section of the flip chip BGA type semiconductor device to which the present invention is applied.

1 Semiconductor chip
1a Electrode pad
2 Insulating substrate
3 Conductor pattern
4 Solder bump
5 Conductor wire
6 Die-bonding material
7, 17 Square sheets
8, 16 Molding resins
9, 19 Semiconductor devices
11, 20 Conductor leads

DESCRIPTION OF THE EMBODIMENTS

Simulation of the warping of the package has been carried out using the finite element method for BGA type semiconductor device 9 shown in FIG. 1, it was compared with a package having a conventional structure (without the square sheet). The composition and size of BGA type semiconductor device 9 used are listed in Table I.

TABLE I

| | Material | Dimensions | Linear expansion coefficient [ppm/° C.] | Modulus of elasticity [kg/mm$^2$] |
|---|---|---|---|---|
| Package | Olesocresol novolac-based epoxy material | 14 mm square, 1.0 mm thick | 60 | 1200 |
| BGA substrate | Straight chain nonthermoplastic polyimide (Eupirex) | 0.07 mm thick | 12 | 840 |
| Semiconductor chip | Silicon | 8.5 mm square, 0.28 mm thick | 2.62 | 13200 |
| Die-bonding material | Epoxy-based | 0.03 mm thick | 0.012 | 1.19 |

Warpage for different square sheets with different linear expansion coefficients, moduli of elasticity, planar sizes and thicknesses that were placed on the chip of said semiconductor device 9, were compared. Warpage of the package was defined as the height of the warp at the periphery of the package relative to the center of the bottom surface of the package.

Table II lists the results of comparing the warpage values of the packages prepared by carrying three types of square sheets having different linear expansion coefficients (3, 8 and 12 ppm/° C.) with a conventional structure without the square sheet. Also, the square sheets used in this case have a modulus of elasticity of 800 kg/mm$^2$, an edge length of 7.5 mm, and a thickness of 0.30 mm.

TABLE II

| Linear expansion coeffecient [ppm/° C.] | Warpage of package [μm] |
|---|---|
| Conventional structure (without the sheet) | 303 |
| 3 | 228 |
| 8 | 229 |
| 12 | 229 |

Table III lists the results of the warpage values for three types of square sheets with different moduli of elasticity (500, 800, and 1200 kg/mm$^2$). In this case, the square sheets used have a linear expansion coefficient of 12 ppm/° C., an edge length of 7.5 mm, and a thickness of 0.30 mm.

TABLE III

| Modulus of elasticity [kg/mm$^2$] | Warpage of package [μm] |
|---|---|
| Conventional structure (without the sheet) | 303 |
| 500 | 237 |
| 800 | 229 |
| 1200 | 222 |

Table IV lists the warpage values for two square sheets of different thickness (0.15 and 0.30 mm). In this case, the square sheets used have a linear expansion coefficient of 12 ppm/° C., a modulus of elasticity of 800 kg/mm$^2$, and an edge length of 7.5 mm.

TABLE IV

| Thickness [mm] | Warpage of package [μm] |
|---|---|
| Conventional structure (without sheet) | 303 |
| 0.15 | 277 |
| 0.30 | 229 |

Table V lists the warpage values of the packages prepared by carrying three square sheets of different edge length (4.5, 6.0, and 7.5 mm). In this case, the square sheets used have a linear expansion coefficient of 12 ppm/° C., a modulus of 800 kg/mm$^2$, and a thickness of 0.30 mm.

TABLE V

| Planar Size [mm] | Warpage of package [μm] |
|---|---|
| Conventional structure (without sheet) | 303 |
| 4.5 | 259 |
| 6.0 | 244 |
| 7.5 | 229 |

The results indicate that it is possible to reduce warpage of the package by placing the square sheet on the semiconductor chip. Also, it can be seen that the warpage of the package decreases the linear expansion coefficient of the square sheet decreases, and as the modulus of elasticity, the thickness, and the edge length increase.

The present invention was explained on the basis of the above-desscribed embodiment and application examples. However, the scope of the application of the present invention is not limited to the aforementioned embodiment and application examples.

As explained above, according to the present invention, it is possible to reduce the warping of the package that would otherwise take place for the conventional semiconductor device having a structure in which the thickness of the molding resin on the upper surface and lower surface (that is, on the two sides) of the semiconductor chip is not uniform, or the molding resin is present only on one side of the semiconductor chip.

What is claimed is:

1. A semiconductor device comprising:
   a semiconductor chip with first and second surfaces and plural electrode pads on one surface,
   a substrate which faces the first surface and has a region for supporting the semiconductor chip,
   conductor leads for forming electrical connections with the semiconductor chip to the outside,
   a connecting means for forming electrical connections between the conductor leads and the electrode pads of the semiconductor chip,
   a molding resin which seals the semiconductor chip, the conductor leads, and the connecting means with a portion of the conductor leads exposed, to form the outer shape of the semiconductor device,
   and a plate-shaped member that is positioned on the second surface of the semiconductor chip and is sealed together with the semiconductor chip with the molding resin, and which has a linear expansion coefficient that is less than the linear expansion coefficient of the molding resin.

2. The semiconductor device described in claim 1 wherein the plate-shaped member has a linear expansion coefficient in the range of 1–20 ppm/° C.

3. The semiconductor device described in claim 2 wherein the plate-shaped member has a modulus of elasticity in the range of 800–15,000 kg/mm$^2$.

4. The semiconductor device described in claim 1 wherein the plate-shaped member is bonded to the second surface of the semiconductor chip.

5. The semiconductor device described in claim 1 wherein the electrode pads are formed in the periphery of the principal surface of the semiconductor chip, and that the plate-shaped member is positioned in the region surrounded by the electrode pads.

6. The semiconductor device described in claim 1 wherein the thickness of the molding resin on the surface of the plate-shaped member is in the range of 0.05–0.4 mm.

7. The semiconductor device described in claim 1 wherein the thickness of the plate-shaped member is in the range of 0.08–1.0 mm.

8. The semiconductor device described in claim 1 wherein the substrate is a flexible insulating substrate, and that the conductor leads include the conductor pattern formed on the flexible insulating substrate and the solder bumps electrically connected to the conductor pattern.

9. The semiconductor device described in claim 1 wherein the conductor leads are formed from a lead frame that extends along the periphery of the semiconductor chip, and that the substrate is a die pad which is offset, relative to the surface where the conductor leads are formed, toward the side opposite the side where the plate-shaped member is located.

10. The semiconductor device described in claim 2 wherein the plate-shaped member is bonded to the second surface of the semiconductor chip.

11. The semiconductor device described in claim 3 wherein the plate-shaped member is bonded to the second surface of the semiconductor chip.

12. The semiconductor device described in claim 2 wherein the electrode pads are formed in the periphery of the principal surface of the semiconductor chip, and that the plate-shaped member is positioned in the region surrounded by the electrode pads.

13. The semiconductor device described in claim 3 wherein the electrode pads are formed in the periphery of the principal surface of the semiconductor chip, and that the plate-shaped member is positioned in the region surrounded by the electrode pads.

14. The semiconductor device described in claim 4 wherein the electrode pads are formed in the periphery of the principal surface of the semiconductor chip, and that the plate-shaped member is positioned in the region surrounded by the electrode pads.

15. The semiconductor device described in claim 2 wherein the substrate is a flexible insulating substrate, and that the conductor leads include the conductor pattern formed on the flexible insulating substrate and the solder bumps electrically connected to the conductor pattern.

16. The semiconductor device described in claim 3 wherein the substrate is a flexible insulating substrate, and that the conductor leads include the conductor pattern formed on the flexible insulating substrate and the solder bumps electrically connected to the conductor pattern.

17. The semiconductor device described in claim 4 wherein the substrate is a flexible insulating substrate, and that the conductor leads include the conductor pattern formed on the flexible insulating substrate and the solder bumps electrically connected to the conductor pattern.

18. The semiconductor device described in claim 2 wherein the conductor leads are formed from a lead frame that extends along the periphery of the semiconductor chip, and that the substrate is a die pad which is offset, relative to the surface where the conductor leads are formed, toward the side opposite the side where the plate-shaped member is located.

19. The semiconductor device described in claim 3 wherein the conductor leads are formed from a lead frame that extends along the periphery of the semiconductor chip, and that the substrate is a die pad which is offset, relative to the surface where the conductor leads are formed, toward the side opposite the side where the plate-shaped member is located.

20. The semiconductor device described in claim 4 wherein the conductor leads are formed from a lead frame that extends along the periphery of the semiconductor chip, and that the substrate is a die pad which is offset, relative to the surface where the conductor leads are formed, toward the side opposite the side where the plate-shaped member is located.

* * * * *